US012562223B2

(12) United States Patent
Su et al.

(10) Patent No.: US 12,562,223 B2
(45) Date of Patent: Feb. 24, 2026

(54) CONTROLLING MEMORY DEVICE USING GROUP RECOVERY TIMES AND METHOD THEREOF

(71) Applicant: MACRONIX INTERNATIONAL CO., LTD., Hsinchu (TW)

(72) Inventors: Wei-Cheng Su, New Taipei (TW); Chih-Hsiang Yang, New Taipei (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 160 days.

(21) Appl. No.: 18/484,513

(22) Filed: Oct. 11, 2023

(65) Prior Publication Data

US 2025/0124979 A1     Apr. 17, 2025

(51) Int. Cl.
*G11C 13/00*          (2006.01)

(52) U.S. Cl.
CPC ...... *G11C 13/0033* (2013.01); *G11C 13/0004* (2013.01); *G11C 13/004* (2013.01); *G11C 13/0069* (2013.01)

(58) Field of Classification Search
CPC ............ G11C 13/0033; G11C 13/0004; G11C 13/004; G11C 13/0069
See application file for complete search history.

(56) References Cited

U.S. PATENT DOCUMENTS

| | | | |
|---|---|---|---|
| 8,086,787 B2 | 12/2011 | Chen et al. | |
| 9,632,926 B1 * | 4/2017 | Souri ................... | G06F 12/0253 |
| 2014/0347936 A1 * | 11/2014 | Ghaly .................... | G11C 29/04 |
| | | | 365/185.18 |
| 2017/0278581 A1 * | 9/2017 | Takizawa ............. | G11C 16/349 |
| 2019/0108889 A1 * | 4/2019 | Gholamipour ...... | G06F 12/0623 |
| 2022/0327050 A1 * | 10/2022 | Kanno .................... | G06F 3/064 |

FOREIGN PATENT DOCUMENTS

TW          I385669 B        2/2013

* cited by examiner

*Primary Examiner* — Jerome Leboeuf
(74) *Attorney, Agent, or Firm* — McClure, Qualey & Rodack, LLP

(57)          ABSTRACT

A control device, for controlling an operation of a memory device, wherein the memory device includes a plurality of memory blocks, each of the memory blocks includes a plurality of memory cells, and each of the memory cells stores a bit-data. The control device comprises the following elements. A processor, for classifying the memory cells into a plurality of groups according to an erase count of each of the memory cells, the groups respectively correspond to a plurality of recovery times. A memory interface control circuit, coupled to the processor and the memory device, and the processor controls the memory device to perform a bit recovery operation through the memory interface control circuit. The processor selects one of the groups according to the recovery times, and performs the bit recovery operation on the bit-data of each of the memory cells in the selected group.

14 Claims, 5 Drawing Sheets

$\mu=0.11$, $R(t)=2\times10^6\times(t/t0)^{0.11}$

Amorphous state (VtR)

$\mu=0.0008$, $R(t)=5.4\times10^3\times(t/t0)^{0.0008}$

Crystal state (VtS)

O_mar

VtS 5.625

VtR 7.875

R_win 0.5

0.75

0.75

4.5   5.25   6   6.5   7   7.5   8.25 8.75   Operation voltage(V)

9

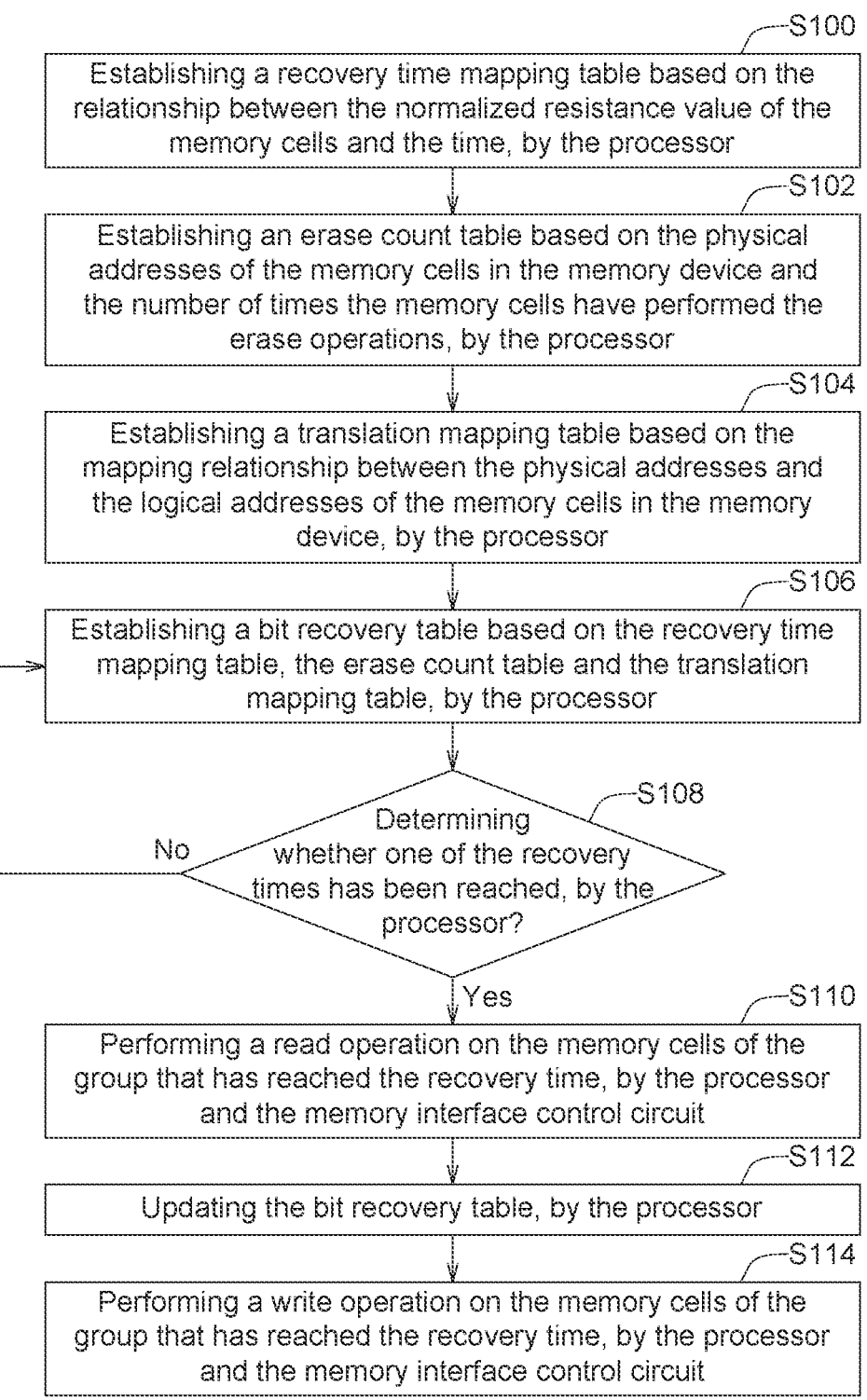

┌─────────────────────────────────────────────────────┐ ┌S100
│ Establishing a recovery time mapping table based on the │
│ relationship between the normalized resistance value of the │
│ memory cells and the time, by the processor │
└─────────────────────────────────────────────────────┘

┌─────────────────────────────────────────────────────┐ ┌S102
│ Establishing an erase count table based on the physical │
│ addresses of the memory cells in the memory device and │
│ the number of times the memory cells have performed the │
│ erase operations, by the processor │
└─────────────────────────────────────────────────────┘

┌─────────────────────────────────────────────────────┐ ┌S104
│ Establishing a translation mapping table based on the │
│ mapping relationship between the physical addresses and │
│ the logical addresses of the memory cells in the memory │
│ device, by the processor │
└─────────────────────────────────────────────────────┘

┌─────────────────────────────────────────────────────┐ ┌S106
│ Establishing a bit recovery table based on the recovery time │
│ mapping table, the erase count table and the translation │
│ mapping table, by the processor │
└─────────────────────────────────────────────────────┘

S108
Determining whether one of the recovery times has been reached, by the processor?

No

Yes

┌─────────────────────────────────────────────────────┐ ┌S110
│ Performing a read operation on the memory cells of the │
│ group that has reached the recovery time, by the processor │
│ and the memory interface control circuit │
└─────────────────────────────────────────────────────┘

┌─────────────────────────────────────────────────────┐ ┌S112
│ Updating the bit recovery table, by the processor │
└─────────────────────────────────────────────────────┘

┌─────────────────────────────────────────────────────┐ ┌S114
│ Performing a write operation on the memory cells of the │
│ group that has reached the recovery time, by the processor │
│ and the memory interface control circuit │
└─────────────────────────────────────────────────────┘

FIG. 5

CONTROLLING MEMORY DEVICE USING GROUP RECOVERY TIMES AND METHOD THEREOF

TECHNICAL FIELD

The present disclosure is related to a control device for a memory device and a control method, and particularly related to bit recovery mechanism for the memory device.

BACKGROUND

In the semiconductor technology, memory cells of a memory device include various types. One of the types is phase change memory (PCM). The phase change memory may operate in a crystal state and an amorphous state. In the amorphous state, the resistance value of the phase change memory will drift with time, and the drift of the resistance value will affect the recognition of the operating state of the phase change memory.

The drift of the resistance value of the phase change memory may be corrected by a refresh operation (i.e., a recovery operation). However, more times of recovery operations will also worsen the drift of the resistance value, which may shorten the lifetime of the phase change memory.

In view of the above issues, it is desirable to have an improved recovery operation mechanism, which may dynamically perform recovery operations for phase change memories with different degrees of drift, such that the number of recovery operations may be reduced.

SUMMARY

According to an aspect of the present disclosure, a control device is provided. The control device is for controlling an operation of a memory device, wherein the memory device includes a plurality of memory blocks, each of the memory blocks includes a plurality of memory cells, and each of the memory cells stores a bit-data. The control device comprises the following elements. A processor, for classifying the memory cells into a plurality of groups according to an erase count of each of the memory cells, the groups respectively correspond to a plurality of recovery times. A memory interface control circuit, coupled to the processor and the memory device, and the processor controls the memory device to perform a bit recovery operation through the memory interface control circuit. The processor selects one of the groups according to the recovery times, and performs the bit recovery operation on the bit-data of each of the memory cells in the selected group.

According to another aspect of the present disclosure, a control method is provided. The control method is for controlling a memory device, wherein the memory device includes a plurality of memory blocks, each of the memory blocks includes a plurality of memory cells, and each of the memory cells stores a bit-data. The control method comprises the following steps. Classifying the memory cells into a plurality of groups according to an erase count of each of the memory cells by a processor, wherein the groups respectively correspond to a plurality of recovery times. Controlling the memory device to perform a bit recovery operation, through a memory interface control circuit, by the processor, comprising selecting one of the groups according to the recovery times, and performing the bit recovery operation on the bit-data of each of the memory cells in the selected group, by the processor.

BRIEF DESCRIPTION OF THE DRAWINGS

FIG. 5 is a flow chart of a control method for the memory device according to an embodiment of the present disclosure.

Figure 1:
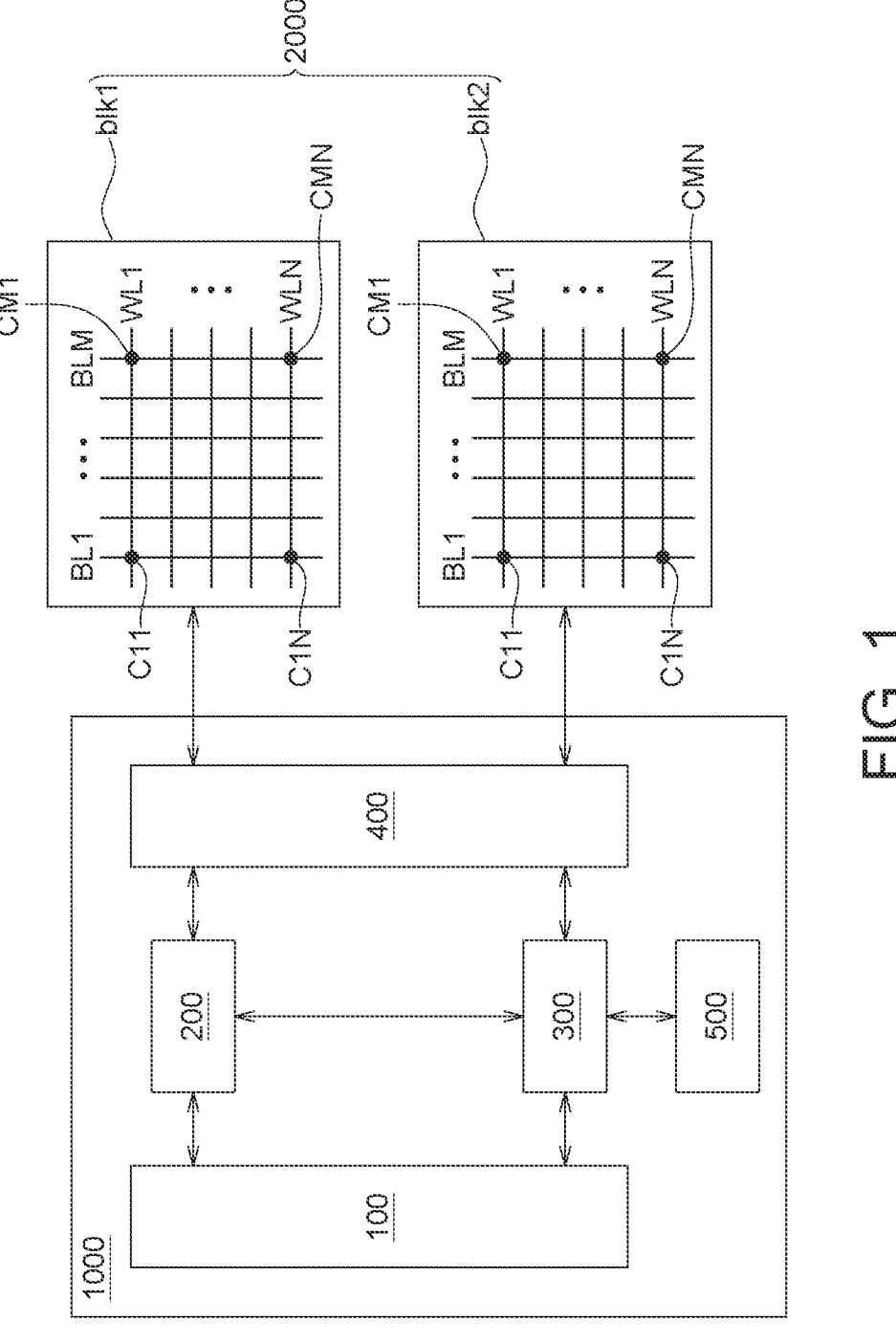
FIG. 1 is a functional block diagram of a control device according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

Please refer to FIG. 1, which is a functional block diagram of a control device 1000 according to an embodiment of the present disclosure. The control device 1000 includes a host interface control circuit 100, a buffer management circuit 200, a processor 300, a memory interface control circuit 400 and a buffer memory 500. The control device 1000 is coupled to the memory device 2000, and the control device 1000 is used to control the operation of the memory device 2000.

In one example, the processor 300 may be an individual computing processor in the control device 1000, such as: a central processing unit (CPU), a micro-processor, a micro-control unit (MCU), a digital signal processor (DSP), an application specific integrated circuit (ASIC) or a field programmable gate array (FPGA), and so on. On the other hand, the host interface control circuit 100, the buffer management circuit 200 and the memory interface control circuit 400 are individual computing circuits in the control device 1000, respectively.

In another example, the control device 1000 may be an individual computing processor, such as an individual CPU, MCU, DSP or FPGA. Correspondingly, each of the host interface control circuit 100, the buffer management circuit 200, the processor 300 and the memory interface control circuit 400 is a single computing unit in the control device 1000.

The processor 300 of the control device 1000 is coupled to the memory device 2000 through the memory interface control circuit 400. The memory device 2000 includes a plurality of memory blocks, such as two memory blocks blk1 and blk2. Each of the memory blocks blk1 and blk2 includes a plurality of memory cells C11~CMN, a plurality of word lines WL1~WLN and a plurality of bit lines BL1~BLM. The memory cells C11~CMN are connected to the word lines WL1~WLN and the bit lines BL1~BLM correspondingly. Each of the memory cells C11~CMN is, for example, a phase change memory (PCM). As a PCM, the resistance value of each of the memory cells C11~CMN in an amorphous state will drift with time.

Figures 2, 3:
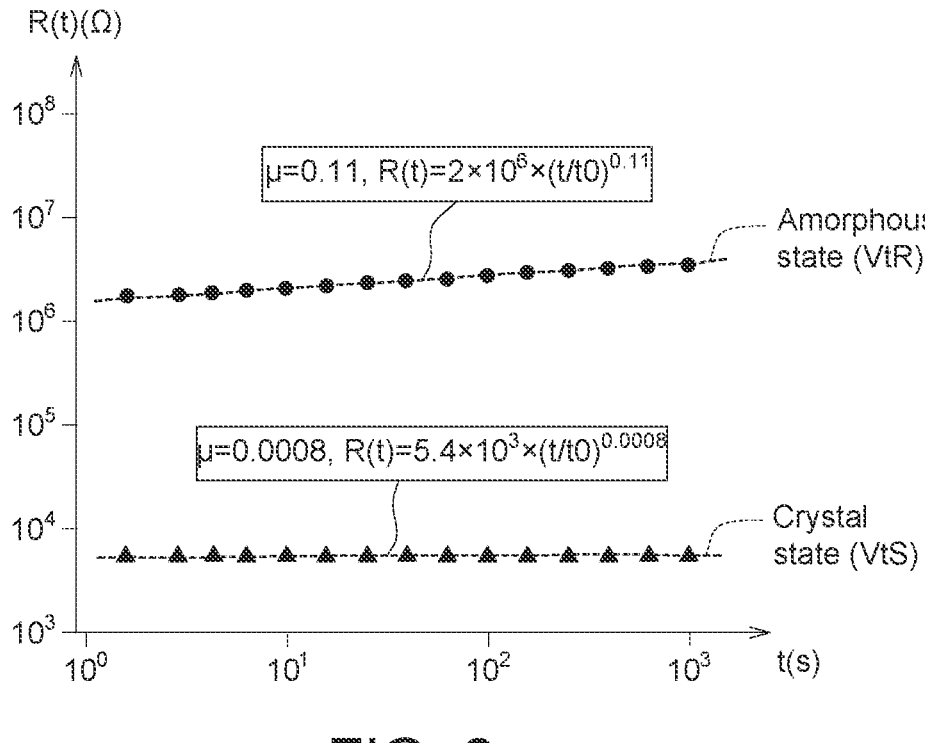
FIG. 2 is a schematic diagram of the drift of the resistance value of the memory cells.
FIG. 3 is a schematic diagram of the operating voltage of the memory cells.

Next, please refer to FIG. 2, which is a schematic diagram of the drift of the resistance value R(t) of the memory cells C11~CMN. The resistance value R(t) of the memory cells C11~CMN is expressed as equation (1):

$$R(t)=R0\times(t/t0)^{\mu} \tag{1}$$

In equation (1), "t" is time, "t0" is an initial time, "μ" is a drift coefficient, and "R0" is a resistance value at the initial time to. In FIG. 2, "VtS" represents a crystal state, and "VtR" represents the amorphous state. When the memory unit cells C11~CMN are in the crystal state, the resistance value R0 at the initial time t0 is equal to $5.4\times(10)^3$ Ω', and the drift coefficient μ is equal to 0.0008. As shown in FIG. 2, the resistance value R(t) in the crystal state may not have great "drift degree" (i.e., the degree of drift).

On the other hand, when the memory unit cells C11~CMN are in the amorphous state, the resistance value R0 at the initial time t0 is equal to $2\times(10)^6$ Ω, and the drift coefficient μ is equal to 0.11. Since the drift coefficient μ in the amorphous state is much greater than that of the crystal state, as shown in FIG. 2, the drift degree with time of the resistance value R(t) of the amorphous state is greater than that of the resistance value R(t) in the crystal state. The drift of the resistance value R(t) in the amorphous state has a negative impact on the state recognition of the operation states of the memory cells C11~CMN.

Next, please refer to FIG. 3, which is a schematic diagram of the operating voltage of the memory cells C11~CMN. In the crystal state, the high bound voltage of the operating voltage of the memory cells C11~CMN is 6V, the low bound voltage is 5.25V, and the voltage corresponding to the peak value is 5.625V. In the amorphous state, the high bound voltage of the operating voltage of the memory cells C11~CMN is 8.25V, the low bound voltage is 7.5V, and the voltage corresponding to the peak value is 7.875V. Therefore, the width of the operation window of the memory cells C11~CMN is 2.25V (i.e., the voltage difference value between the voltage 5.625V corresponding to the peak value of the crystal state and the voltage 7.878V corresponding to the peak value of the amorphous state. On the other hand, a reading window R_win of the memory cells C11~CMN is between the voltage 6.5V and the voltage 7V, and the width of the reading window R_win is 0.5V. In addition, the operation margin O_mar of the memory cells C11~CMN is between the voltage 4.5V and the voltage 9V. The high bound voltage of the operating voltage in amorphous state must be lower than the high bound voltage 9V of the operating margin O_mar.

When the resistance value R(t) of the memory cells C11~CMN drifts with time, the high bound voltage/low bound voltage of the amorphous and/or crystal states of the memory cells C11~CMN will also drift, thus affecting the recognition of the operating status of memory cells C11~CMN. For example, when the resistance value R(t) drifts, the high bound voltage of the amorphous state of the memory cells C11~CMN increases to 8.75V. In one example, according to the high bound voltage 9V of the operating margin O_mar, a tolerance of the drift of the high bound voltage of the amorphous state is set to 10%. Therefore, when the high bound voltage of the amorphous state of one or more of the memory cells C11~CMN increases (i.e., drifts upward) to 8.75V, it is necessary to selectively perform a "refresh operation" on one or more of the memory cells C11~CMN which occur to drift, which is also referred to as a "recovery operation". When each of the memory cells C11~CMN stores one bit of data, the refresh operation is also referred to as a "bit recovery operation". In the following paragraphs, the refresh operation of the memory cells C11~CMN are generally referred to as "bit recovery operation".

From the perspective of operating voltage, when the drift of the high bound voltage of the amorphous state reaches a predetermined tolerance (for example, 10%), a bit recovery operation must be selectively performed on the memory cells C11~CMN. From the perspective of the resistance value R(t), when the drift of the resistance value R(t) reaches a predetermined tolerance (for example, 10%), a bit recovery operation must be selectively performed on the memory cells C11~CMN.

Figure 4:
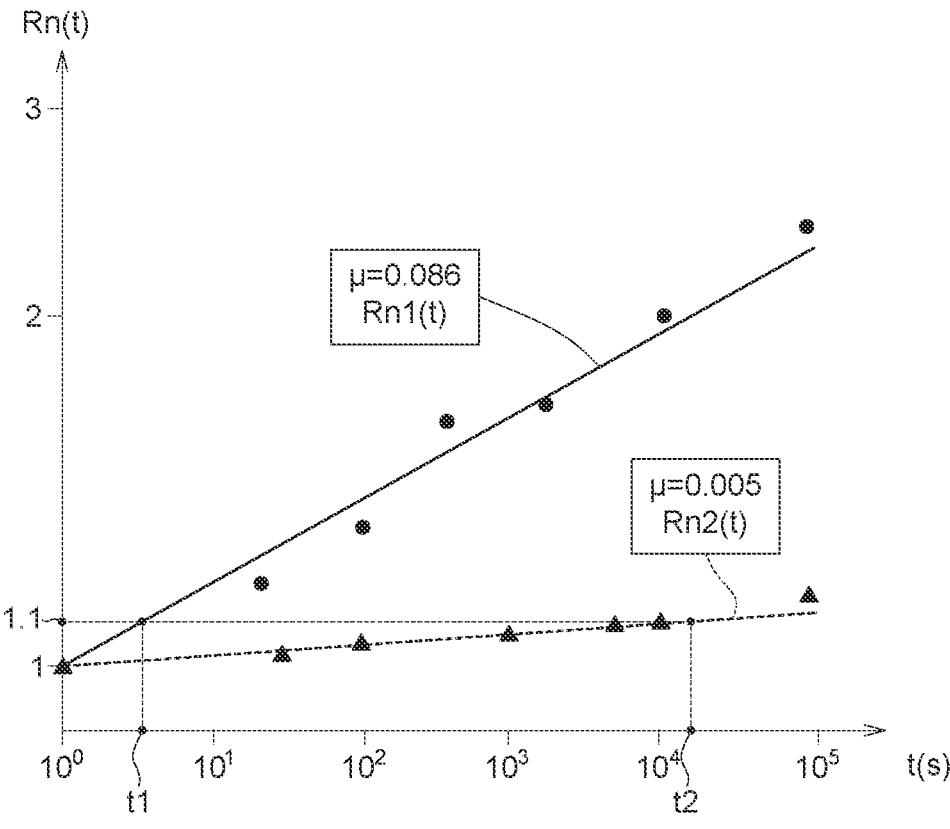
FIG. 4 is a schematic diagram of one embodiment of the relationship between the normalized resistance value of the memory cells and the time.

Next, please refer to FIG. 4, which is a schematic diagram of one embodiment of the relationship between the normalized resistance value Rn(t) of the memory cells C11~CMN and the time t. To normalize the resistance value R(t) of the memory cells C11~CMN with respect to the resistance value R0 at the initial time t0 to obtain a normalized resistance value Rn(t). At the initial time t0, the normalized resistance value Rn(t0) of the memory cell C11~CMN is equal to value of 1. The normalized resistance value Rn(t) in the amorphous state will drift with time, and the drift amount of the normalized resistance value Rn(t) (that is, an amount of change compared to the normalized resistance value Rn(t0)=1 at the initial time t0) is related to the drift coefficient μ. When the drift coefficient μ is smaller, it takes a longer time for the normalized resistance value Rn(t) to increase to the value of 1.1 (that is, the drift amount reaches the 10% tolerance). In contrast, when the drift coefficient μ is greater, the drift amount of the normalized resistance value Rn(t) may reach the 10% tolerance in a shorter time.

For example, when the drift coefficient μ is equal to a smaller value of 0.005, it takes a longer time t2 for the normalized resistance value Rn2(t2) to increase to a value of 1.1. Time t2 is approximately equal to 10E4 (10 to the 4th power) seconds. In contrast, when the drift coefficient μ is equal to a greater value of 0.086, in a shorter time t1 (time t1 is less than 10 seconds) the normalized resistance value Rn1(t1) increases to the value of 1.1.

When the drift amount of the normalized resistance value Rn(t) of the memory cell C11~CMN reaches a tolerance of 10%, a bit recovery operation must be selectively performed on the memory cells C11~CMN. In a comparative example, as long as the drift amount of the normalized resistance value Rn(t) of one of the memory cells C11~CMN reaches a tolerance of 10%, bit recovery operations are performed for all memory cells C11~CMN. However, as the number of times (i.e., cycling times) of bit recovery operations of the memory cells C11~CMN increases, the wear level of the memory cells C11~CMN will increase, thereby damaging lifetime of the memory cells C11~CMN. Moreover, the number of times of the bit recovery operations of the memory cells C11~CMN will also affect the drift coefficient μ. In the above comparative example, when the drift amount of the resistance value of the memory cell (such as the memory cell C11), which has a greater resistance value, the drift reaches a tolerance of 10% and the bit recovery operation is performed, other better memory cells (those with less wear level) also need to perform bit recovery operations. Excessive bit recovery operations will increase the wear of the better memory cells.

Compared with the above comparative example, the bit recovery mechanism of the present disclosure applies dynamic refresh periods on memory cells with different drift degrees for resistance value. A higher frequency bit recovery operation is performed on the memory cell with a greater drift amount of resistance value, and a lower frequency bit recovery operation is performed on the memory cell with a less drift amount of resistance value. Therefore, the number of times of bit recovery operations for better memory cells (those with less wear level) may be reduced.

Next, please refer to FIG. 5, which is a flow chart of a control method for the memory device 2000 according to an embodiment of the present disclosure. The control method shown in FIG. 5 is related to the bit recovery mechanism, which is applied to the memory cells C11~CMN in the memory blocks blk1 and blk2 of the memory device 2000. The flow of the bit recovery mechanism is described as follows. Firstly, in step S100, a "recovery time mapping table" is established by the processor 300 of the control device 1000. The processor 300 may establish the recovery time mapping table based on the relationship between the normalized resistance values Rn(t) of the memory cells C11~CMN and the time t. Please also refer to FIG. 6, which is a schematic diagram of another embodiment of the relationship between the normalized resistance value Rn(t) of the memory cells C11~CMN and the time t (which is similar to the embodiment in FIG. 4). The drift coefficient $\mu$ of the resistance value R(t) of the memory cells C11~CMN is related to the number of times of erase operations that have been performed. The number of times of performed erase operations is referred to as "erase count", and the amount of the erase count may also be referred to as "cycle times". When the erase count of a memory cell is greater, it indicates that such a memory cell has performed more times of erase operations. Therefore, the wear level of this memory cell is greater, resulting in a greater drift coefficient $\mu$ of its resistance value R(t).

For example, an erase count EC1 of each memory cell of a portion of the memory cells C11~CMN is between 10E6 (10 to the 6th power) and 10E5. According to a relation-curve of the normalized resistance value Rn1($t$) of this portion of memory cells and the time t, it may be estimated that the drift coefficient $\mu$ of this portion of memory cells is substantially equal to value of 0.08. Please also refer to Table 1, which is an example of a recovery time mapping table established by the processor 300. In the recovery time mapping table, the memory cells with the erase count EC1 between 10E6 and 10E5 are classified as a group G1.

Figure 6:
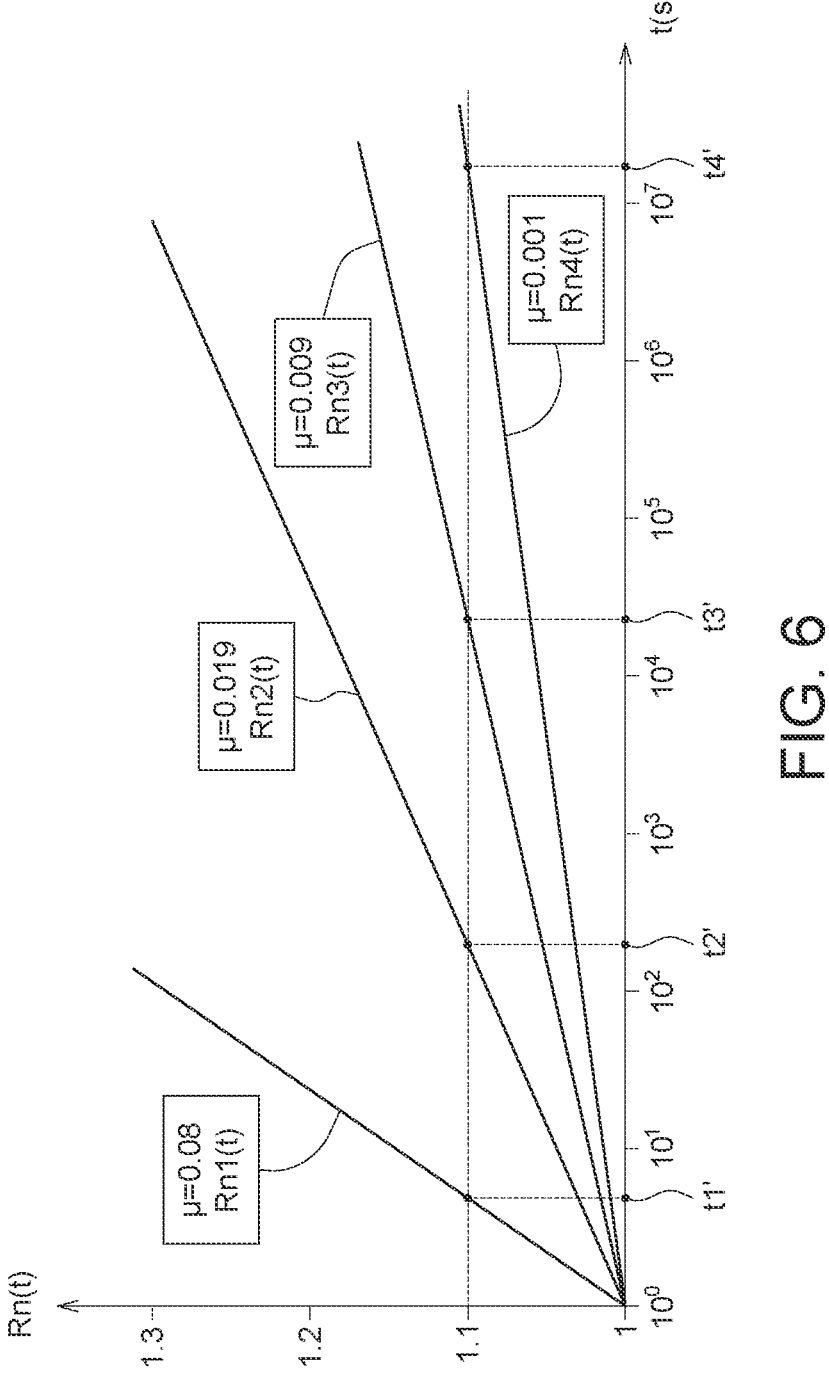
FIG. 6 is a schematic diagram of another embodiment of the relationship between the normalized resistance value of the memory cells and the time.

Moreover, according to the relationship between the normalized resistance value Rn(t) and the time t as shown in FIG. 6, the normalized resistance value Rn1($t$) of the memory cells of the group G1 increases to value of 1.1 at time t1', that is, the drift amount of the normalized resistance value Rn1($t$) reaches a tolerance of 10% at time t1'. The time t1' is about 4 seconds. Therefore, each memory cell of the group G1 must perform one time of bit recovery operation before the time t1'.

Referring to Table 1 again, the time for the memory cells of the group G1 to perform the bit recovery operation is defined as "recovery time RT1". The recovery time RT1 of each memory cell of the group G1 must be less than the time t1' shown in FIG. 6. For example, the recovery time RT1 is set as 10E0 second (i.e., 1 second).

TABLE 1

| (recovery time mapping table) | | |
| --- | --- | --- |
| Erase count | Recovery time (s) | Group of memory cells |
| 10E5 < EC1 < 10E6 | RT1 = 10E0 | G1 |
| 10E4 < EC2 < 10E5 | RT2 = 10E2 | G2 |

TABLE 1-continued

| (recovery time mapping table) | | |
| --- | --- | --- |
| Erase count | Recovery time (s) | Group of memory cells |
| 10E3 < EC3 < 10E4 | RT3 = 10E4 | G3 |
| 10E2 < EC4 < 10E3 | RT4 = 10E7 | G4 |

On the other hand, the erase count EC2 of each memory cell in another portion of the memory cells C11~CMN is between 10E5 and 10E4, which indicates that the memory cells in this portion are performed with fewer times of erase operations. The wear level of these memory cells is less, hence the resistance value R(t) thereof has a smaller drift coefficient $\mu$. According to the relation-curve between the normalized resistance value Rn2($t$) of this portion of memory cells and the time t, it may be estimated that the drift coefficient $\mu$ thereof is substantially equal to value of 0.019. In the recovery time mapping table, the memory cells with a erase count EC2 between 10E5 and 10E4 are classified as the group G2. Moreover, according to FIG. 6, the normalized resistance value Rn2($t$) of the memory cells of the group G2 increases to value of 1.1 at time t2' (the drift amount thereof reaches a tolerance of 10% at time t2'), and the time t2' is about 2×10E2 seconds. Correspondingly, in the recovery time mapping table, the recovery time RT2 of each memory cell of the group G2 is set as 10E2 seconds, and the recovery time RT2 is less than the time t2'.

Furthermore, an erase count EC3 of each memory cell in still another portion of the memory cells C11~CMN is between 10E4 and 10E3, indicating that this portion of the memory cells has been performed with fewer times of erase operations, and therefore has a less wear level, and the resistance value R(t) thereof has a smaller drift coefficient $\mu$. The memory cells with the erase count EC3 between 10E4 and 10E3 are classified as the group G3. According to the relation-curve of the normalized resistance value Rn3($t$) of the memory cells of the group G3 and the time t, it may be estimated that the drift coefficient $\mu$ thereof is substantially equal to value of 0.009, and may be estimated that the normalized resistance value Rn3($t$) reaches a tolerance of 10% at time t3' (the time t3' is about 2×10E4 seconds). In the recovery time mapping table, the recovery time RT3 of each memory cell of the group G3 is set as 10E4 seconds, which is less than the time t3'.

Similarly, an erase count EC4 of each memory cell of yet another portion of the memory cells C11~CMN is between 10E3 and 10E2, indicating that the wear level is less, and therefore has a smaller drift coefficient $\mu$. The memory cells with the erase count EC4 between 10E3 and 10E2 are classified as the group G4. It may be estimated that the drift coefficient $\mu$ of the memory cells of the group G4 is substantially equal to value of 0.001, the normalized resistance value Rn4($t$) thereof reaches a tolerance of 10% at time t4' (the time t4' is about 2×10E7 seconds). In the recovery time mapping table, the recovery time RT4 of each memory cell of the group G4 is set as 10E7 seconds, which is less than the time t4'.

Next, in step S102, the processor 300 of the control device 1000 establishes an "erase count table" based on the physical addresses of the memory cells in the memory device 2000 and the number of times the memory cells have performed erase operations. Table 2 is an example of the erase count table, in which the erase count of the memory cells with physical address "1" is 5.2×10E5, the erase count of the memory cells with physical address "5" is 4.7×10E3, and the erase count of the memory cells with physical address "9" is 2.2×10E2, and so on.

TABLE 2

| (erase count table) | |
| --- | --- |
| Physical address | Erase count |
| 1 | 5.2 × 10E5 |
| 5 | 4.7 × 10E3 |
| 9 | 2.2 × 10E2 |
| 28 | 3.9 × 10E5 |
| . . . | . . . |
| 17 | 2.8 × 10E2 |
| 22 | 1.7 × 10E4 |

Next, in step S104, based on the mapping relationship between the physical addresses and the logical addresses of the memory cells in the memory device 2000, the processor 300 of the control device 1000 establishes a "translation mapping table". Table 3 is an example of the translation mapping table, in which the physical address "1" of the memory cells is mapped to the logical address "0", the physical address "5" of the memory cells is mapped to the logical address "1", and the physical address "9" of the memory cells is mapped to the logical address "2", and so on.

TABLE 3

| (translation mapping table) | |
| --- | --- |
| Logical address | Physical address |
| 0 | 1 |
| 1 | 5 |
| 2 | 9 |
| 3 | 28 |
| . . . | . . . |
| 30 | 17 |
| 31 | 22 |

Next, in step S106, the processor 300 of the control device 1000 establishes a "bit recovery table" based on the recovery time mapping table, the erasure count table and the translation mapping table. Table 4 is an example of the bit recovery table, in which the memory cells with physical address "1" have a erase count of 5.2×10E5, which is between 10E6 and 10E5. According to the recovery time mapping table of Table 1, memory cells with the erase count between 10E6 and 10E5 are classified as the group G1. Therefore, the memory cells with the physical address "1" are classified as the group G1.

On the other hand, the memory cells with physical address "5" have a erase count of 4.7×10E3, which is between 10E4 and 10E3. According to the recovery time mapping table of Table 1, memory cells with the erase count between 10E4 and 10E3 are classified as the group G3. Therefore, the memory cells with the physical address "5" are classified as the group G3.

Similarly, the erase count of the memory cells with physical address "9" is 2.2×10E2, which is between 10E2 and 10E3. According to the recovery time mapping table in Table 1, the memory cells with the erase count between 10E2 and 10E3 are classified as the group G4, hence the memory cells with the physical address "9" are classified as group G4.

As the above rules, the memory cells with physical address of "28" have the erase count of 3.9×10E5 and are classified as the group G1. The memory cells with physical address of "17" have the erase count of 2.8×10E2 and are classified as group G4. The memory cells with physical address of "22" have the erase count of 1.7×10E4 and are classified as group G2.

TABLE 4

| (bit recovery table) | | |
| --- | --- | --- |
| Physical address | Erase count | Group of memory cells |
| 1 | 5.2 × 10E5 | G1 |
| 5 | 4.7 × 10E3 | G3 |
| 9 | 2.2 × 10E2 | G4 |
| 28 | 3.9 × 10E5 | G1 |
| . . . | . . . | |
| 17 | 2.8 × 10E2 | G4 |
| 22 | 1.7 × 10E4 | G2 |

According to the bit recovery table in Table 4, it may be obtained that memory cells with different physical addresses in the memory device 2000 are classified as group G1, group G2, group G3 or group G4. Different groups of memory cells have different wear levels. In the bit recovery mechanism of this embodiment, the processor 300 selectively performs bit recovery operations for different groups of memory cells based on the bit recovery table. In other words, bit recovery operations are performed individually in response to different wear levels of the memory cells. The bit recovery mechanism of this embodiment includes four recovery operation periods, and these recovery operation periods correspond to the recovery times RT1-RT4 of the memory cells of the groups G1-G4. Only one group is performed with bit recovery operations in one recovery operation period. For example, only the group G1 is performed with bit recovery operations in the recovery operation period for recovery time RT2 (i.e., 10E2 seconds), and so on.

The processor 300 selects one of the groups G1-G4 based on the recovery times RT1-RT4, and performs a bit recovery operation for the bit-data of each memory cell in the selected group. In step S108, it is determined whether one of the recovery times RT1-RT4 is reached. If the determination result is "No", return to step S106. If the determination result is "yes", steps S110 and S112 are executed, the processor 300 selects the group which reaches the recovery time, and performs a bit recovery operation for each memory cell in the selected group. For example, when the determination result of step 108 indicates that the recovery time RT1 is reached, and the processor 300 selects the group G1 corresponding to the recovery time RT1, and performs a bit recovery operation for each memory cell in the selected group G1. Bit recovery operations include read operations and write operations. In this embodiment, the processor 300 of the control device 1000 controls the memory device 2000 to perform read operations and write operations of individual groups of memory cells, through the memory interface control circuit 400.

In step S110, a read operation is performed on the memory cells of the group that reach the recovery time. For example, if the determination result in step S108 indicates that the recovery time RT1 has been reached, the processor 300 controls the memory device 2000 to perform a read operation on all the memory cells of the group G1 through the memory interface control circuit 400, such that the bit-data stored in each memory cell of group G1 is read into the buffer memory 500.

Next, in step S112, the processor 300 updates the bit recovery table. For example, if the erase counts of some memory cells in the memory device 2000 have changed, the processor 300 adjusts the classification of these groups, and classifies these memory cells into appropriate groups based on the latest erase counts.

Next, in step S114, a write operation is performed on the memory cells of the group that have reached the recovery time, such that the bit-data, which are read into the buffer memory 500 in step S110, may be written back to the memory cells of this group. Taking the group G1 that has reached the recovery time RT1 as an example, the processor 300 controls the memory device 2000 through the memory interface control circuit 400 to write the bit-data (which are previously read into the buffer memory 500) back to the memory cells of the group G1.

The read operation and the write operation in the bit recovery operation of this embodiment are dominated by the processor 300 of the control device 1000, and the processor 300 controls the memory device 2000 to perform the read operation and the write operation through the memory interface control circuit 400, so as to make the bit-data of a specific group of memory cells in the memory device 2000 accessed in the buffer memory 500. On the other hand, the normal read operations and write operations are performed by the processor 300 in cooperation with the host interface control circuit 100 and the buffer management circuit 200.

Next, refer to Table 5, which is an example of a corresponding table of recovery time and address of the present disclosure. The bit recovery mechanism of the present disclosure is dynamically performed, in which bit recovery operations are dynamically performed according to the recovery times RT1-RT4 of memory cells of different physical addresses. For example, the memory cells at physical address "1" are performed with bit recovery operations when the recovery time RT1 (i.e. 10E0 second) is reached. The memory cells at physical address "5" are performed with bit recovery operations when the recovery time RT3 (i.e. 10E4 seconds) is reached. The memory cells at physical address "9" are performed with bit recovery operations when the recovery time RT4 (i.e. 10E7 second) is reached.

TABLE 5

| (corresponding table of recovery time and address, of the present disclosure) | | |
|---|---|---|
| Physical address | Erase count | Recovery time (s) |
| 1 | 5.2 × 10E5 | RT1 = 10E0 |
| 5 | 4.7 × 10E3 | RT3 = 10E4 |
| 9 | 2.2 × 10E2 | RT4 = 10E7 |
| 28 | 3.9 × 10E5 | RT1 = 10E0 |
| . . . | . . . | |
| 17 | 2.8 × 10E2 | RT4 = 10E7 |
| 22 | 1.7 × 10E4 | RT2 = 10E2 |

On the other hand, referring to Table 6, which is a corresponding table of recovery time and address of a comparative example. In this comparative example, as long as the drift amount of one of the memory cells of the memory device 2000 reaches a predetermined tolerance, bit recovery operations are performed on all the memory cells in the same memory block. In other words, the bit recovery mechanism of this comparative example may not be dynamically adjusted. For example, the erase count of the memory cells at physical address "1" has a greater value of 5.2×10E5, which means that the memory cells at physical address "1" have the greatest wear level, and these memory cells have reached the tolerance of the drift amount, at the recovery time RT1 (i.e., 10E0 second). At the earlier recovery time RT1, bit recovery operations must be performed on all the memory cells in the same memory block. Therefore, the memory cells at different physical addresses in the same memory block perform bit recovery operations at the same time, the time for execution is equal to the recovery time RT1. Even though the memory cells at some addresses have smaller erase count, these memory cells still need to perform bit recovery operations at the earlier recovery time RT1, causing these memory cells with smaller erase count to be performed with bit recovery operations earlier, which may increase wear level thereof.

TABLE 6

| (corresponding table of recovery time and address, of a comparative example) | | |
|---|---|---|
| Physical address | Erase count | Recovery time (s) |
| 1 | 5.2 × 10E5 | RT1 = 10E0 |
| 5 | 4.7 × 10E3 | RT3 = 10E0 |
| 9 | 2.2 × 10E2 | RT4 = 10E0 |
| 28 | 3.9 × 10E5 | RT1 = 10E0 |
| . . . | . . . | |
| 17 | 2.8 × 10E2 | RT4 = 10E0 |
| 22 | 1.7 × 10E4 | RT2 = 10E0 |

Compared with the fixed bit recovery mechanism of the above comparative example, the dynamic bit recovery mechanism of the present disclosure is dynamically performed on the groups G1-G4 with different recovery times RT1-RT4 respectively. Different groups of memory cells are performed with bit recovery operations at different times. Therefore, memory cells with smaller erase count are performed with bit recovery operations at a later recovery time (for example, recovery time RT4=10E7 seconds), which may reduce wear level thereof.

In the above-mentioned several embodiments, the bit recovery mechanism of the present disclosure is to classify the memory cells into four groups G1~G4. In other embodiments, when the drift coefficient μ is greater, the drift amount may reach the predetermined tolerance in a shorter time, and the memory cells with different erase counts (corresponding to different drift coefficients μ) may have greater difference in their recovery time. Therefore, the memory cells may be further divided into more groups, such as 16 groups G1~G16, so as to more accurately and flexibly perform bit recovery operations on the memory cells with different erase counts (representing different wear levels).

It will be apparent to those skilled in the art that various modifications and variations may be made to the disclosed embodiments. It is intended that the specification and examples be considered as exemplary only, with a true scope of the disclosure being indicated by the following claims and their equivalents.

What is claimed is:

1. A control device, for controlling an operation of a memory device, wherein the memory device includes a plurality of memory blocks, each of the memory blocks includes a plurality of memory cells, and each of the memory cells is a phase change memory which operates in a crystalline state and an amorphous state, having a normalized resistance value and storing a bit-data, the control device comprising:

a processor, for classifying the memory cells into a plurality of groups according to an erase count of each of the memory cells, the groups respectively correspond to a plurality of recovery times; and a memory interface control circuit, coupled to the processor and the memory device, and the processor controls the memory device to perform a bit recovery operation through the memory interface control circuit, wherein, the processor selects one of the groups according to the recovery times, and the recovery time of each of the groups is a time for a drift amount of the normalized resistance value to reach a predefined tolerance, and the processor performs the bit recovery operation on the bit-data of each of the memory cells in the selected group, when the erase count of the memory cells in the selected group is greater than the erase count of the memory cells in a first group of the groups, the bit recovery operation for the selected group is performed earlier than the first group.

2. The control device according to claim 1, further comprising:

a buffer memory, coupled to the processor, wherein, the bit recovery operation includes a read operation and a write operation, the processor performs the read operation to read the bit-data of each of the memory cells in the selected group into the buffer memory, and the processor performs the write operation to write the bit-data, which has been read into the buffer memory, back to a corresponding one of the memory cells.

3. The control device according to claim 1, wherein the processor establishes a recovery time mapping table according to the normalized resistance value of each of the memory cells, and the recovery time mapping table includes a corresponding relationship between the recovery time of each of the groups and the erase count of each of the memory cells in the group.

4. The control device according to claim 3, wherein the processor establishes an erase count table according to a physical address of each of the memory cells in the memory device and the erase count.

5. The control device according to claim 4, wherein the processor establishes a translation mapping table according to a mapping relationship between a logical address of each of the memory cells in the memory device and the physical address.

6. The control device according to claim 5, wherein the processor establishes a bit recovery table according to the recovery time mapping table, the erasure count table and the translation mapping table, and selectively performs the bit recovery operation for the groups according to the bit recovery table.

7. The control device according to claim 6, wherein, after performing the bit recovery operation, the processor updates the bit recovery table to adjust a classification of the groups.

8. A control method for a memory device, wherein the memory device includes a plurality of memory blocks, each of the memory blocks includes a plurality of memory cells, and each of the memory cells is a phase change memory which operates in a crystalline state and an amorphous state, having a normalized resistance value and storing a bit-data, the control method comprising:

classifying the memory cells into a plurality of groups according to an erase count of each of the memory cells by a processor, wherein the groups respectively correspond to a plurality of recovery times; and controlling the memory device to perform a bit recovery operation, through a memory interface control circuit, by the processor, comprising:

selecting one of the groups according to the recovery times, wherein the recovery time of each of the groups is a time for a drift amount of the normalized resistance value to reach a predefined tolerance, and performing the bit recovery operation on the bit-data of each of the memory cells in the selected group, by the processor, wherein when the erase count of the memory cells in the selected group is greater than the erase count of the memory cells in a first group of the groups, the bit recovery operation for the selected group is performed earlier than the first group.

9. The control method according to claim 8, wherein, the step of performing the bit recover operation comprising:

performing a read operation to read the bit-data of each of the memory cells in the selected group into a buffer memory, by the processor; and performing a write operation to write the bit-data, which has been read into the buffer memory, back to a corresponding one of the memory cells, by the processor.

10. The control method according to claim 8, further comprising:

establishing a recovery time mapping table according to the normalized resistance value of each of the memory cells, by the processor, wherein, the recovery time mapping table includes a corresponding relationship between the recovery time of each of the groups and the erase count of each of the memory cells in the group.

11. The control method according to claim 10, further comprising:

establishing an erase count table according to a physical address of each of the memory cells in the memory device and the erase count, by the processor.

12. The control method according to claim 11, further comprising:

establishing a translation mapping table according to a mapping relationship between a logical address of each of the memory cells in the memory device and the physical address, by the processor.

13. The control method according to claim 12, further comprising:

establishing a bit recovery table according to the recovery time mapping table, the erasure count table and the translation mapping table, by the processor; and selectively performing the bit recovery operation for the groups according to the bit recovery table, by the processor.

14. The control method according to claim 13, wherein, after the step of performing the bit recovery operation, the control method further comprising:

updating the bit recovery table to adjust a classification of the groups, by the processor.

* * * * *